United States Patent [19]
Carpi et al.

[11] Patent Number: 6,114,074
[45] Date of Patent: Sep. 5, 2000

[54] EXTRUSION ENHANCED MASK FOR IMPROVING PROCESS WINDOW

[75] Inventors: Enio Luiz Carpi, Fishkill; Shahid Butt, Wappingers Falls, both of N.Y.

[73] Assignee: Siemens Aktiengesellschaft, Munich, Germany

[21] Appl. No.: 09/266,473

[22] Filed: Mar. 11, 1999

[51] Int. Cl.[7] .................................................. G03F 9/00
[52] U.S. Cl. ........................................................... 430/5
[58] Field of Search ............................... 430/5, 322, 324, 430/394; 250/492.2

[56] References Cited

U.S. PATENT DOCUMENTS 5,731,109   3/1998   Hwang ........................................ 430/5
5,851,701  12/1998   Rolfson ....................................... 430/5

Primary Examiner—S. Rosasco
Attorney, Agent, or Firm—Donal B. Paschburg

[57] ABSTRACT

A pattern for a mask used in lithographic processing, in accordance with the invention, includes a plurality of elongated structures disposed substantially parallel to each other on a substrate and a plurality of sub-resolution extrusions extending transversely from the elongated structures into spaces between the elongated structures, the plurality of extrusions having a substantially same size in a direction parallel to the elongated structures, the plurality of extrusions being spaced apart periodically in the direction parallel to the elongated structures, the elongated structures and extrusions being formed from an energy absorbent material.

21 Claims, 4 Drawing Sheets

EXTRUSION ENHANCED MASK FOR IMPROVING PROCESS WINDOW

BACKGROUND

1. Technical Field

This disclosure relates to semiconductor fabrication tools and more particularly, to an extrusion enhanced mask for improving a process window for lithographic processes in semiconductor technology.

2. Description of the Related Art

Semiconductor fabrication processes typically include photolithographic processing to pattern areas of a surface of a semiconductor device. The semiconductor fabrication process typically includes applying a photoresist material to the surface of the semiconductor device. The photoresist is patterned by exposing the photoresist to light, typically ultraviolet light, to crosslink the resist material (negative resist). This cross linking prevents a reaction with a developer which develops away areas of the photoresist which were not crosslinked by the exposure to the UV light. Other types of photoresist have chains broken by exposure (positive resist) to ultraviolet light.

Photoresists are patterned using a photomask. The photomask functions as a shield to prevent light form passing through it in predetermined areas during photolithography. The photomask typically provides a black or highly absorbent layer of material, usually chromium or a chromium alloy, patterned in accordance with the patterning design to be projected onto the photoresist. The absorbent layer is formed on a substrate, which may include a glass or quartz material. Other techniques are used which may include electrons and electron beam masks, scattering masks and/or stencil masks, for example, scattering with angular limitation in projection electron beam lithography (SCALPEL).

With decreasing feature sizes of semiconductor components, masks are increasingly more difficult to fabricate and inspect. It is known that advanced semiconductor processing is very sensitive to image quality provided by masks. The defect fabrication capability for reticles is limited to a certain minimum feature size. This minimum feature size typically depends on the process and fabrication tools used to provide the pattern on the reticle.

Image quality is dependent on the resolution capability of the optical lithography process. When a photo mask is used, variations in a semiconductor wafer may affect the resolution. For example, wafer imperfections or size changes may vary from lot to lot. The resolution capability of an optical lithography system is generally defined as $k_1 \lambda/NA$ where $k_1$ is a constant related to the process conditions, $\lambda$ is the illumination wavelength of the light shown through the mask, and NA is the numerical aperture of the optical lithography system. A depth of focus (DOF) is defined as $k_2 \lambda/NA^2$, where $k_2$ is another process constant. From this relationship, it is clear that smaller feature sizes may be printed, but at the expense of the depth of focus. Depth of focus relates to the ability to focus the illuminating light on the semiconductor wafer which is to be process using photolithography. A larger depth of focus is desired since it provides easier manufacturing processes for lithography. The flexibility or tolerance afforded an optical system is described in terms of exposure latitude. The greater the exposure latitude the more robust the optical system. Smaller feature sizes, however, have smaller exposure latitudes. Due to a certain amount of randomness associated with manufacturing process, both a large depth of focus and exposure latitude are desired.

For manufacturing processes, the depth of focus and the exposure latitude are maintained within a predefined specifications. These specifications are achieved only for certain values of the depth of focus and the exposure latitude. The values of the exposure latitude and the depth of field should provide optical illumination within the manufacturing specifications. These quantities may be combined as a product which is referred to as the process window, i.e., exposure latitude times depth of focus. Alternately, an area below the curve of a plot of depth of focus versus exposure latitude may be used to determine the process window. This is known as a total process window, i.e., area under the curve=total process window. The process window may include bounds for providing optical illumination within the manufacturing specifications.

Therefore, a need exists for an apparatus for improving the process window such that optical illumination is provided within the manufacturing specifications over a greater range of values. A further need exists for increasing the depth of focus and the exposure latitude while maintaining or improving resolution for features to be imaged.

SUMMARY OF THE INVENTION

A pattern for a mask used in lithographic processing, in accordance with the invention, includes a plurality of elongated structures disposed substantially parallel to each other on a substrate and a plurality of sub-resolution extrusions extending transversely from the elongated structures into spaces between the elongated structures, the plurality of extrusions having a substantially same size in a direction parallel to the elongated structures, the plurality of extrusions being spaced apart periodically in the direction parallel to the elongated structures, the elongated structures and extrusions being formed from an energy absorbent material.

A lithographic mask includes a transparent substrate having a pattern formed thereon for providing photolithographic images on a semiconductor wafer, the pattern formed on the substrate by a radiation absorbing material. The pattern includes an array of elongated structures disposed substantially parallel to each other on the substrate to provide a lithographic image during semiconductor fabrication. A plurality of sub-resolution extrusions are included, extending transversely from the elongated structures into spaces between the elongated structures, the plurality of extrusions having a substantially same size in a direction parallel to the elongated structures, the plurality of extrusions being spaced apart periodically in the direction parallel to the elongated structures.

A system for creating lithographic images on a semiconductor wafer includes a radiation source for providing illumination radiation for imaging the semiconductor wafer. A mask is disposed between the semiconductor wafer and the radiation source for providing an image on the semiconductor wafer. The mask includes a plurality of elongated structures disposed substantially parallel to each other on a substrate and a plurality of sub-resolution extrusions extending transversely from the elongated structures into spaces between the elongated structures, the plurality of extrusions having a substantially same size in a direction parallel to the elongated structures, the plurality of extrusions being spaced apart periodically in the direction parallel to the elongated structures, the elongated structures and extrusions being formed from an energy absorbent material. A lens system is included for focusing the radiation from the mask onto the semiconductor wafer such that a process window for the system is improved due to the extrusions.

In alternate embodiments, the extrusions may be rectangular, triangular or semi-circular in shape. The substantially same size may be between about 0.1 to about 0.3 times a minimum feature size, preferably between about 0.15 to about 0.2 times the minimum feature size. The extrusions may be spaced apart between about 0.1 to about 0.8 times a minimum feature size, preferably between about 0.2 to about 0.6 times the minimum feature size. The elongated structures may be spaced apart by a minimum feature size. The energy absorbent material may include at least one of chromium, carbon and molybdenum, such as molybdenum silicide in attenuated phase shift masks (PSM). The pattern, mask and/or system is employed to image one of metal lines and gate conductors for semiconductor devices.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

This disclosure relates to semiconductor fabrication tools and more particularly, to an extrusion enhanced mask for improving a process window for lithography of semiconductor materials. The present invention provides extrusions on a mask having predetermined spacings and sizing which improve the process window for an optical lithographic process. The extrusions advantageously increase depth of field and/or exposure latitudes for the lithographic imaging processes. In this way, manufacturing processes are improved by making the imaging processes more robust, and increasing an overall process window for the process.

Figure 1:
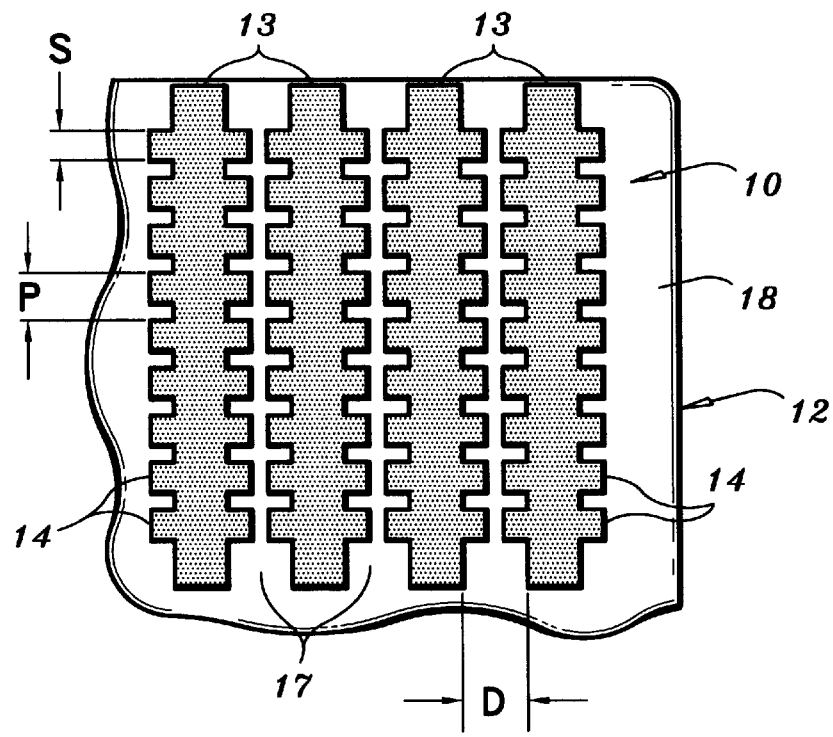
FIG. 1 is a top plan view of a pattern for providing images for a semiconductor fabrication process in accordance with the invention.
Figure 2A:
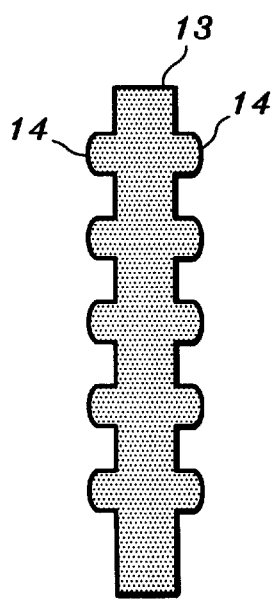
FIGS. 2A–B are top plan views of extrusions having different shapes in accordance with the invention.
Figure 2B:
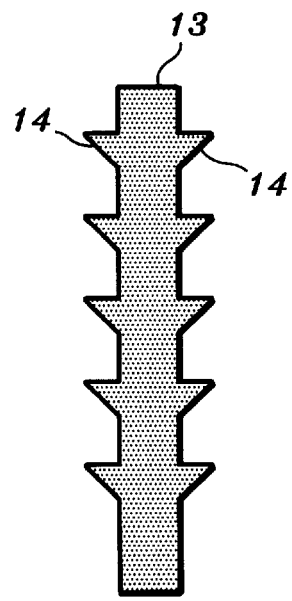

Referring now in specific detail to the drawings in which like reference numerals identify similar or identical elements throughout the several views, and initially to FIG. 1, a extrusion structure or pattern 10 is shown in accordance with the present invention. Extrusion structure 10 is formed on a substrate 18 as a pattern for a photomask or electron mask 12 (mask 12) which is preferably used for lithographic imaging on semiconductor structures such as semiconductor wafers. Extrusion structure 10 includes a base structure 13 which may be an elongated structure such as a line or a rectangle. Base structure 13 has extrusions 14 extending transversely from base structure 13. In a preferred embodiment, extrusions 14 are substantially perpendicular to an elongated axis running down the length of base structure 13. As shown in FIGS. 2A–B, extrusions 14 may include a plurality of different shapes, such as semicircles, triangles, rectangles, etc. As shown in FIG. 1, extrusions 14 are squares.

Extrusions are separated by a predetermined distance P. P may be referred to as a period between corresponding features of extrusions 14. In preferred embodiments, P is between about 0.1 F to about 0.8 F microns, preferably between 0.2 F and 0.6 F, where F is the minimum feature size. The size of the extrusions 14, as indicated by S, is preferably between about 0.1 F to about 0.3 F, preferably between about 0.15 to about 0.2 times the minimum feature size, although other sizes may be used. Base structures 12 are separated by a predetermined distance D which is used to produce structures on semiconductor devices using imaging. In one embodiment, spacings D between base structures 13 are used to image metal lines or gate conductors for semiconductor memory devices. D may include a distance capable of producing a minimum feature size F for the given technology. P, S and D may be adjusted according to the magnifications used for the optical lithography processing. For example, D may have a dimension of 0.7 microns which is reduced to 0.175 microns when providing an image (a reduction of 4 times). The dimensions of P and S may also be given based on the reduction of 4 times for the image provided to the semiconductor device. In other words, if S is 0.1 microns on mask 12 the image on the semiconductor device is 0.025 microns. For a 4 times reduction in image size, the preferred dimensions on mask 12 for P are between about 0.1 microns and about 0.5 microns. For a 4 times reduction in image size, the preferred dimensions on mask 12 for S are between about 0.1 microns and about 0.2 microns. Extrusions 14 are sub-resolution extrusions, i.e., preferably having dimensions smaller than the minimum feature size for the technology. Extrusions 14 may extend into spaces 17 between base structure 13. Extrusions preferably extend a distance equal to about the size, S, although other dimensions may be used. Although FIG. 1 shows extrusion structure 10 having extrusions 14 on all base structures 13 and in opposing directions, extrusions 14 need not be used on all structures (i.e., base structures 13) and can be employed selectively across a pattern.

Figure 3:
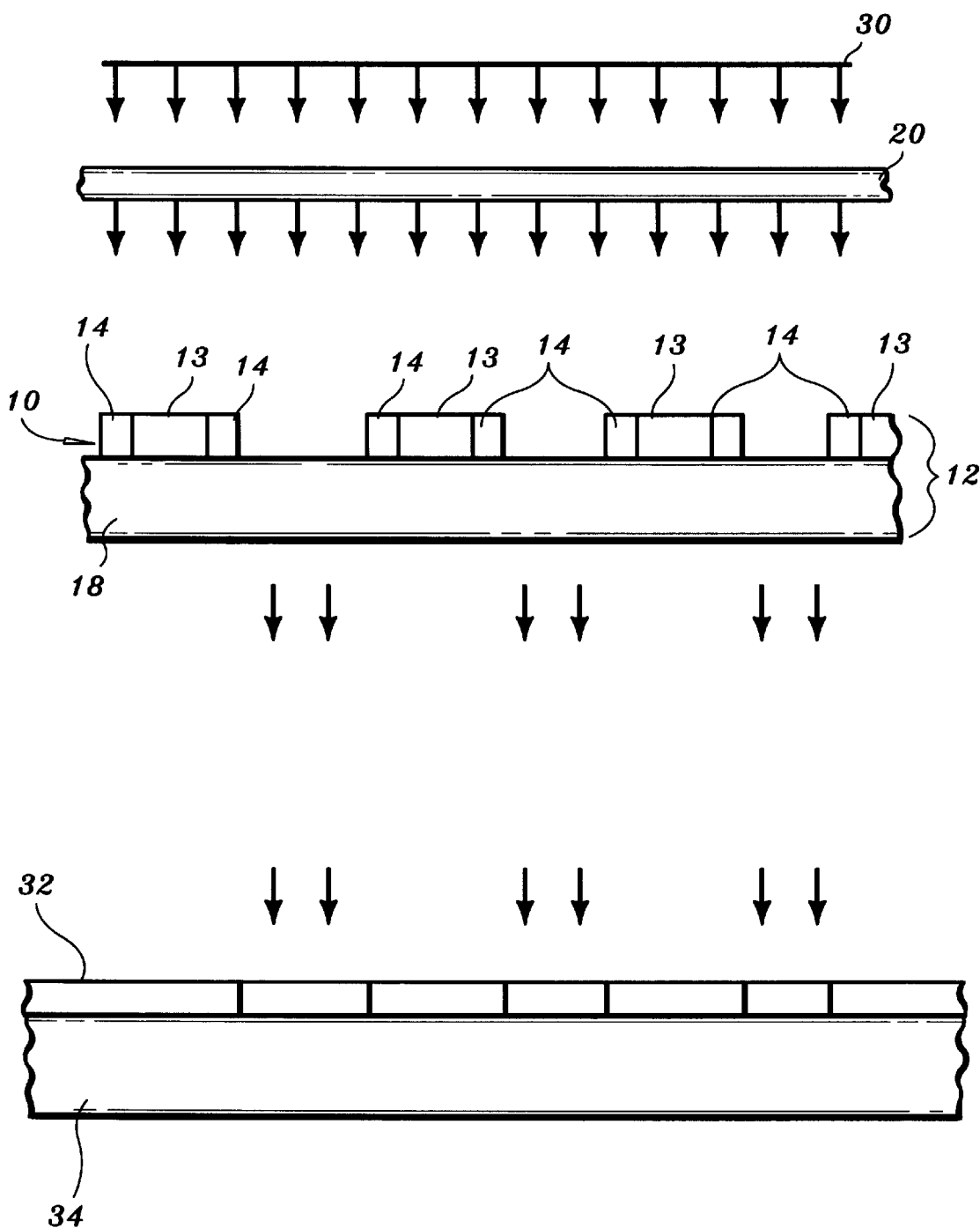
FIG. 3 is a cross-sectional view of a system for lithographically imaging semiconductor wafers in accordance with the invention.

Referring to FIG. 3, mask 12 includes extrusions 14 and base structures 13 as part of a pattern for providing lithographic images in accordance with the invention. Extrusion structures 10 are formed from an energy absorbent material, such as, chromium, molybdenum or their alloys, carbon or metal oxides on a glass or quartz substrate 18 to form mask 12. A lens system 20 is included for focusing light (or other illumination types) generated by an energy source 30 onto a surface 32, such as a surface of a semiconductor wafer 34 for lithographic imaging. As described above lens system 20 preferably includes a 4 times reduction in the image from the size of mask 12 pattern. The ability to focus an image on surface 32 is a function of the depth of focus and exposure latitude permitted by the components of the optical system including mask 12. Energy source 30 may include light or electrons depending on the resist used.

SIMULATION RESULTS

To further demonstrate the present invention, simulations were run by the inventors to illustratively show the improvement in process window yielded by the invention. Simulations were run by providing an array of base structures with extrusions as shown in FIG. 1. Specific values for P and for S were used in accordance with Table 1.

TABLE 1

| Extrusion Matrix | Size, S | |
|---|---|---|
| Period, P | 0.1 microns | 15 microns |
| .2 microns | A | D |
| .3 microns | B | E |
| .4 microns | C | F |

Figure 4:
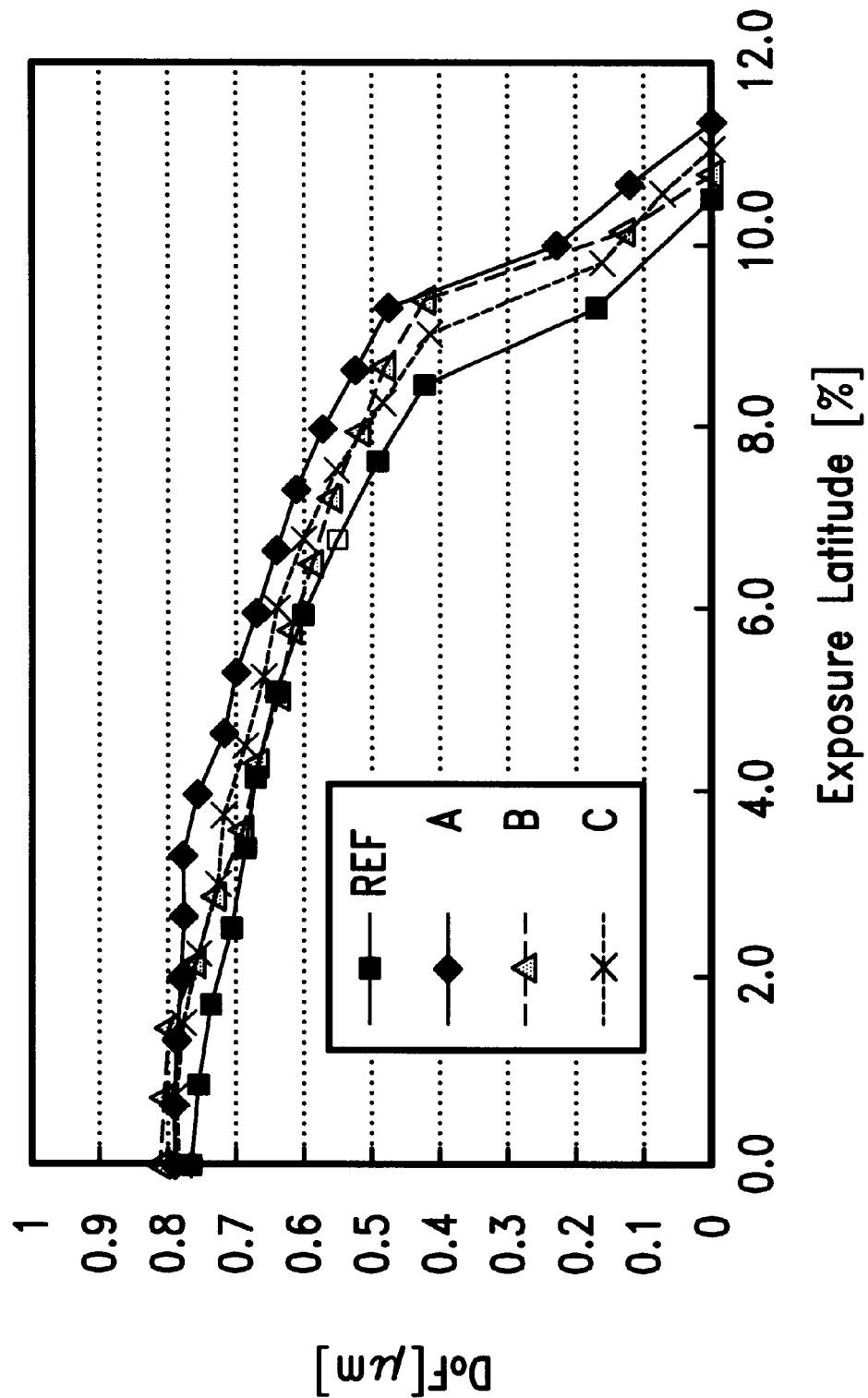
FIG. 4 is a plot of depth of focus versus exposure latitude for extrusions having a constant size and different periodicity in accordance with the present invention.
Figure 5:
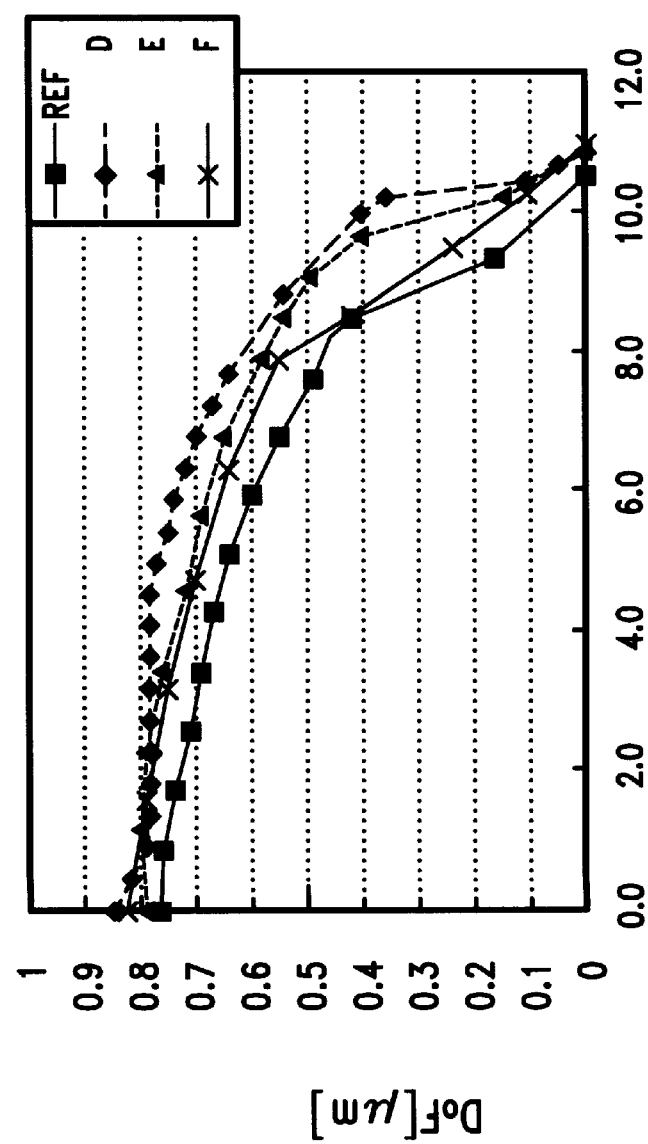
FIG. 5 is another plot of depth of focus versus exposure latitude for extrusions having another constant size and different periodicity in accordance with the present invention.
Figure 6:
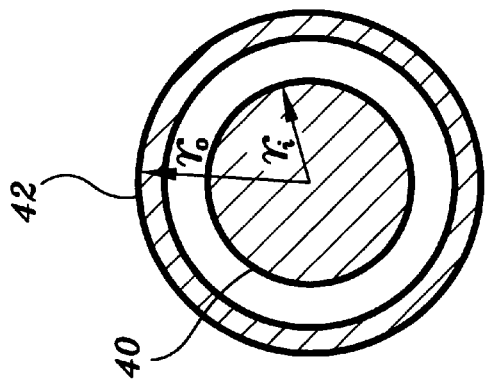
FIG. 6 is a cross-sectional view of an annular illumination pattern used during a simulation of the present invention.

Referring to FIGS. 4 and 5, improvements in the process window in accordance with the present invention are illustratively shown by way of example for the extrusion structure 10 of FIG. 1. Annular illumination was provided during the simulation. Annular illumination includes a solid circle of light 40 surrounded by a concentric circle 42 of light as shown in FIG. 6. By providing annular illumination, a prior art reference array of lines was illuminated on a reference photomask to determine depth of focus and exposure latitude. The illumination included $\frac{2}{3}$ (inner to outer radii ratio=$r_i/r_o$) annular and conventional $\sigma$=0.75 where $\sigma$ in the coherence of the light. The reference array of lines were spaced apart 0.7 microns which created an image of 0.175 microns (4 times reduction). Depth of focus and exposure latitude were measured and recorded for the reference array (REF) and recorded in FIG. 4 for size S=0.1 microns and periods 0.2, 0.3 and 0.4 microns and in FIG. 5 for size S=0.15 microns and periods of 0.2, 0.3 and 0.4 microns.

As is apparent from FIGS. 4 and 5, extrusions 14 provide increased depth of field and increased exposure latitude over the reference (REF) structure. The results are summarized in Table 2 for the extrusions types A–F as shown in Table 1.

TABLE 2

| Design | Maximum total process window | Depth of focus at 0% exposure latitude (microns) | Exposure latitude at 0 microns depth of focus (%) |
|---|---|---|---|
| REF | 5.80 | .77 | 10.5 |
| A | 6.87 | .79 | 11.3 |
| B | 6.40 | .82 | 10.7 |
| C | 6.34 | .79 | 11.0 |
| D | 7.24 | .85 | 10.9 |
| E | 6.85 | .80 | 10.8 |
| F | 6.43 | .83 | 10.9 |

As is apparent, the extrusions of the present invention result in greater depth of focus and exposure latitude thereby providing an improved process window. Further improvements on the process window may be obtained if higher coherences are used. Other illumination techniques and types are contemplated for the present invention.

It is to be appreciated that although the present invention is described in terms of semiconductor processing, other lithographic processes are covered by the invention. For example, lithographic writing or other submicron processing.

Having described preferred embodiments for an extrusion enhanced mask for improving process windows (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A pattern for a mask used in lithographic processing comprising:
    a plurality of elongated structures disposed substantially parallel to each other on a substrate; and
    a plurality of sub-resolution extrusions extending transversely from the elongated structures into spaces between the elongated structures, the plurality of extrusions having a substantially same size in a direction parallel to the elongated structures, the plurality of extrusions being spaced apart periodically in the direction parallel to the elongated structures, the elongated structures and extrusions being formed from an energy absorbent material.

2. The pattern as recited in claim 1, wherein the extrusions are one of rectangular, triangular and semi-circular in shape.

3. The pattern as recited in claim 1, wherein the substantially same size is between about 0.1 to about 0.3 times a minimum feature size.

4. The pattern as recited in claim 1, wherein the extrusions are spaced apart between about 0.1 to about 0.8 times a minimum feature size.

5. The pattern as recited in claim 1, wherein the elongated structures are spaced apart by a minimum feature size.

6. The pattern as recited in claim 1, wherein the energy absorbent material includes at least one of chromium, carbon and molybdenum.

7. The pattern as recited in claim 1, wherein the pattern is employed to image one of metal lines and gate conductor for semiconductor devices.

8. A lithographic mask comprising:
    a transparent substrate having a pattern formed thereon for providing photolithographic images on a semiconductor wafer, the pattern formed on the substrate by a radiation absorbing material;
    the pattern including:
        an array of elongated structures disposed substantially parallel to each other on the substrate to provide a lithographic image during semiconductor fabrication; and
        a plurality of sub-resolution extrusions extending transversely from the elongated structures into spaces between the elongated structures, the plurality of extrusions having a substantially same size in a direction parallel to the elongated structures, the plurality of extrusions being spaced apart periodically in the direction parallel to the elongated structures.

9. The mask as recited in claim 8, wherein the extrusions are one of rectangular, triangular and semi-circular in shape.

10. The mask as recited in claim 8, wherein the substantially same size is between about 0.1 to about 0.3 times a minimum feature size.

11. The mask as recited in claim 8, wherein the extrusions are spaced apart between about 0.1 to about 0.8 times a minimum feature size.

12. The mask as recited in claim 8, wherein the elongated structures are spaced apart by a minimum feature size.

13. The mask as recited in claim 8, wherein the radiation absorbing material includes at least one of chromium, carbon and molybdenum.

14. The mask as recited in claim 8, wherein the mask is employed to image one of metal lines and gate conductors for emiconductor devices.

15. A system for creating lithographic images on a semiconductor wafer comprising:

a radiation source for providing illumination radiation for imaging the semiconductor wafer;

a mask disposed between the semiconductor wafer and the radiation source for providing an image on the semiconductor wafer, the mask including:
  a plurality of elongated structures disposed substantially parallel to each other on a substrate; and
  a plurality of sub-resolution extrusions extending transversely from the elongated structures into spaces between the elongated structures, the plurality of extrusions having a substantially same size in a direction parallel to the elongated structures, the plurality of extrusions being spaced apart periodically in the direction parallel to the elongated structures, the elongated structures and extrusions being formed from an energy absorbent material; and a lens system for focusing the radiation from the mask onto the semiconductor wafer such that a process window for the system is improved due to the extrusions.

16. The system as recited in claim 15, wherein the extrusions are one of rectangular, triangular and semicircular in shape.

17. The system as recited in claim 15, wherein the substantially same size is between about 0.1 to about 0.3 times a minimum feature size.

18. The system as recited in claim 15, wherein the extrusions are spaced apart between about 0.1 to about 0.8 times a minimum feature size.

19. The system as recited in claim 15, wherein the elongated structures are spaced apart by a minimum feature size.

20. The system as recited in claim 15, wherein the energy absorbing material includes at least one of chromium, carbon and molybdenum.

21. The system as recited in claim 15, wherein the mask is employed to image one of metal lines and gate conductors for semiconductor devices.

* * * * *